(12) United States Patent
Liu et al.

(10) Patent No.: US 9,653,931 B2
(45) Date of Patent: May 16, 2017

(54) BATTERY PROTECTION DEVICE AND OPERATION METHOD THEREOF

(71) Applicant: uPI Semiconductor Corp., Hsinchu County (TW)

(72) Inventors: Tung-Hang Liu, Hsinchu County (TW); Chih-Liang Wu, Hsinchu County (TW); Wei-Jung Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 247 days.

(21) Appl. No.: 14/710,608

(22) Filed: May 13, 2015

(65) Prior Publication Data

US 2016/0149423 A1 May 26, 2016

(30) Foreign Application Priority Data

Nov. 20, 2014 (TW) .............................. 103140233 A

(51) Int. Cl.
*H02J 7/00* (2006.01)
*G01R 31/36* (2006.01)
*H02H 7/18* (2006.01)

(52) U.S. Cl.
CPC ........ *H02J 7/0029* (2013.01); *G01R 31/3606* (2013.01); *H02H 7/18* (2013.01); *H02J 2007/0039* (2013.01); *H02J 2007/0067* (2013.01)

(58) Field of Classification Search
USPC ................. 320/116, 118, 134, 136, 162, 164
See application file for complete search history.

(56) References Cited

U.S. PATENT DOCUMENTS

| 5,896,025 A * | 4/1999 | Yamaguchi ........... H02J 7/0031 320/134 |
| 7,365,952 B2 | 4/2008 | Sato |
| 8,525,482 B2 * | 9/2013 | Takeda .................. H02J 7/0029 320/127 |
| 2009/0171601 A1 * | 7/2009 | Wong ..................... G01R 15/04 702/63 |
| 2012/0249087 A1 * | 10/2012 | Kimura .................... H02H 7/18 320/164 |
| 2013/0229144 A1 | 9/2013 | Nagata et al. |
| 2016/0047861 A1 * | 2/2016 | Chen ................. G01R 31/3606 361/78 |

* cited by examiner

*Primary Examiner* — Brian Ngo
(74) *Attorney, Agent, or Firm* — Jianq Chyun IP Office

(57) ABSTRACT

A battery protection device adapted to be electrically connected to a load and a battery set and including a signal terminal, a discharge circuit and a control circuit is provided. The signal terminal is electrically connected to the load. The discharge circuit is electrically connected to the signal terminal. The control circuit detects a sensing voltage from the signal terminal, and counts a number of times that the battery protection device is switched to a protection mode from a normal mode, so as to obtain a counting value. The control circuit determines whether to enter the protection mode or the normal mode according to a reference voltage. In the protection mode, the control circuit adjusts the reference voltage or the control circuit controls the discharge circuit to form a discharge path passing through the signal terminal, the discharge circuit and a ground.

17 Claims, 7 Drawing Sheets

BATTERY PROTECTION DEVICE AND OPERATION METHOD THEREOF

CROSS-REFERENCE TO RELATED APPLICATION

This application claims the priority benefit of Taiwan application serial no. 103140233, filed on Nov. 20, 2014. The entirety of the above-mentioned patent application is hereby incorporated by reference herein and made a part of this specification.

BACKGROUND OF THE INVENTION

1. Field of the Invention

The invention relates to a protection device and an operation method thereof, and particularly relates to a battery protection device and an operation method thereof.

2. Description of Related Art

Generally speaking, a battery protection device has an over-current protection mechanism to prevent a battery set from providing an excessive discharge current to a load, thereby preventing the damage of over-current to the battery set and the load. The conventional battery protection device compares the voltage at a low voltage terminal of the load and a rated voltage, and activates or deactivates the over-current protection based on a comparison result. However, such method leads to a consequence that the conventional battery protection device may deactivate the over-current protection right after entering the over-current protection due to an abnormality of the load, thus making the conventional battery protection device repetitively activate the over-current protection.

SUMMARY OF THE INVENTION

The invention provides a battery protection device and an operation method thereof capable of adjusting a reference voltage or forming a discharge path according to a counting value in connection with a number of times of switching to a protection mode. Thus, the battery protection device may be prevented from repetitively activating over-current protection due to an abnormality of a load.

A battery protection device of the invention is adapted to be electrically connected to a battery set and a load. The battery protection device includes a signal terminal a discharge circuit, and a control circuit. The signal terminal is configured to be electrically connected to the load. The discharge circuit is electrically connected to the signal terminal. The control circuit is electrically connected to the signal terminal and the discharge circuit to detect a sensing voltage from the signal terminal. In addition, the control circuit counts a number of times that the battery protection device switches from a normal mode to a protection mode, so as to obtain a counting value. Moreover, the control circuit determines whether to enter the normal mode or the protection mode according to a reference voltage. In the protection mode, the control circuit adjusts the reference voltage according to the counting value or controls the discharge circuit according to the counting value to form a discharge path passing through the signal terminal, the discharge path, and a ground.

An operation method of a battery protection device of the invention includes steps as follows. The battery protection device is adapted to be electrically connected to a battery set and a load. The load is electrically connected through a signal terminal of the battery protection device. A voltage from the signal terminal is detected to obtain a sensing voltage. A number of times of switching from the normal mode to the protection mode are counted to obtain a counting value. The counting value is configured to record the number of times of switching from the normal mode to the protection mode. In the protection mode, the reference voltage is adjusted according to the counting value or a discharge path is farmed according to the counting value, and the signal terminal of the battery protection device is conductive to a ground through the discharge path.

Based on the above, in the invention, the counting value is used to record the number of times that the battery protection device switches from the normal mode to the protection mode. Besides, in the protection mode of the invention, the reference voltage is adjusted according to the counting value or a discharge path is formed according to the counting value. Thus, the battery protection device is able to determine the abnormality of the load, so as to prevent the battery protection device from repetitively activating the over-current protection due to the abnormality of the load.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
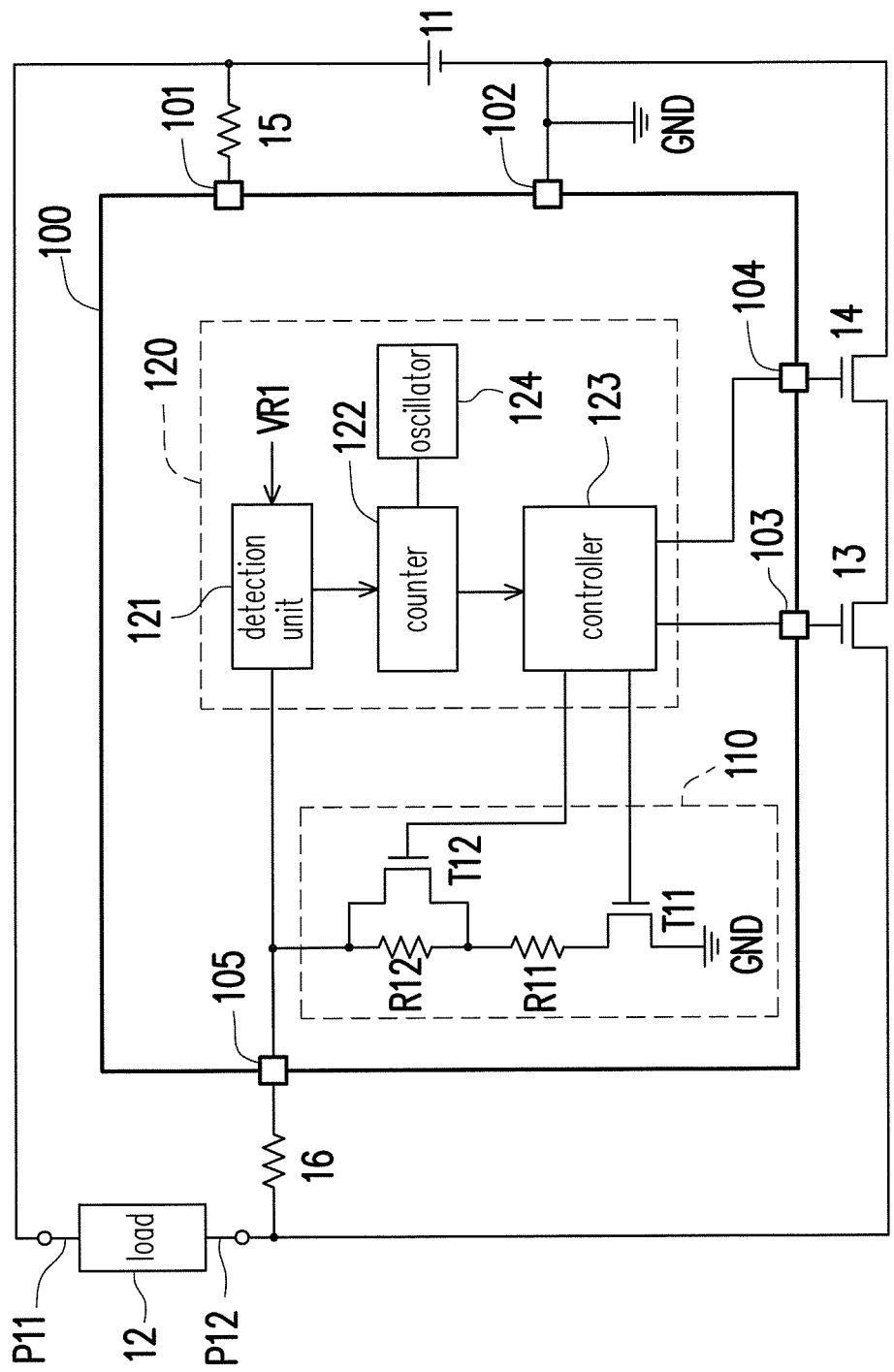
FIG. 1 is a schematic view illustrating a battery protection device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating a battery protection device according to an embodiment of the invention. Referring to FIG. 1, a battery protection device 100 is adapted to protect and control a battery set 11. The battery protection device 100 includes a positive power terminal 101, a negative power terminal 102, a charge protection signal terminal 103, a discharge protection terminal 104, and a signal terminal 105. The battery set 11 may supply power to a load 12. A first end P11 of the load 12 is electrically connected to a first end of the battery set 11, and a second end P12 of the load 12 is electrically connected to a second end of the battery set 11 through a charge protection switch 13 and a discharge protection switch 14.

The battery protection device 100 is electrically connected to the first end of the battery set 11 through the positive power terminal 101 and a resistor 15, and is electrically connected to the second end of the battery set 11 through the negative power terminal 102. In addition, the battery protection device 100 may control the charge protection switch 13 and the discharge protection switch 14 through the charge protection signal terminal 103 and the discharge protection signal terminal 104, so as to control charging and discharging of the battery set 11 to the load 12. In addition, the charge protection device 100 may further be electrically connected to the second end of the load 12 through the signal terminal 105 and a resistor 16, so as to obtain a sensing voltage in connection with a discharge current.

More specifically, the battery protection device 100 includes a discharge circuit 110 and a control circuit 120. The discharge circuit 110 is electrically connected to the signal terminal 105 of the battery protection device 100, and the control circuit 120 is electrically connected to the discharge circuit 110. In an operation, when the battery protection device 100 detects that the discharge current provided by the battery set 11 is excessive, namely when the battery protection device 100 detects an over-current, the battery protection device 100 turns off the discharge protection switch 14. In addition, the battery protection device 100 may control the discharge circuit 110 to make the signal terminal 105 conductive to a ground GND, such that the second end P12 of the load 12 is conductive to the ground GND. Thus, the battery protection device 100 may activate over-current protection, and may deactivate the over-current protection through the discharge circuit 110.

The discharge circuit 110 includes a first resistor R11, a second resistor R12, a first switch T11 and a second switch T12. The first resistor R11, the second resistor R12, and the first switch T11 are connected in series between the signal terminal 105 and the ground GND. In addition, the second switch T12 and the second resistor R12 are connected in parallel with each other. Namely, a first end of the second resistor R12 is electrically connected to the signal terminal 105. A first end of the first resistor R11 is electrically connected to a second end of the second resistor R12, and a second end of the first resistor R11 is electrically connected to a first end of the first switch T11. A second end of the first switch T11 is electrically connected to the ground GND. A first end of the second switch T12 is electrically connected to the first end of the second resistor R12, and a second end of the second switch T12 is electrically connected to the second end of the second resistor R12.

The control circuit 120 includes a detection unit 121, a counter 122, a controller 123, and an oscillator 124. The detection unit 121 is electrically connected to the signal terminal 105. The counter 122 is electrically connected to the detection unit 121 and the oscillator 124. The controller 123 is electrically connected to the counter 122, the charge protection signal terminal 103, the discharge protection signal terminal 104, the first switch T11, and the second switch T12.

Figure 2:
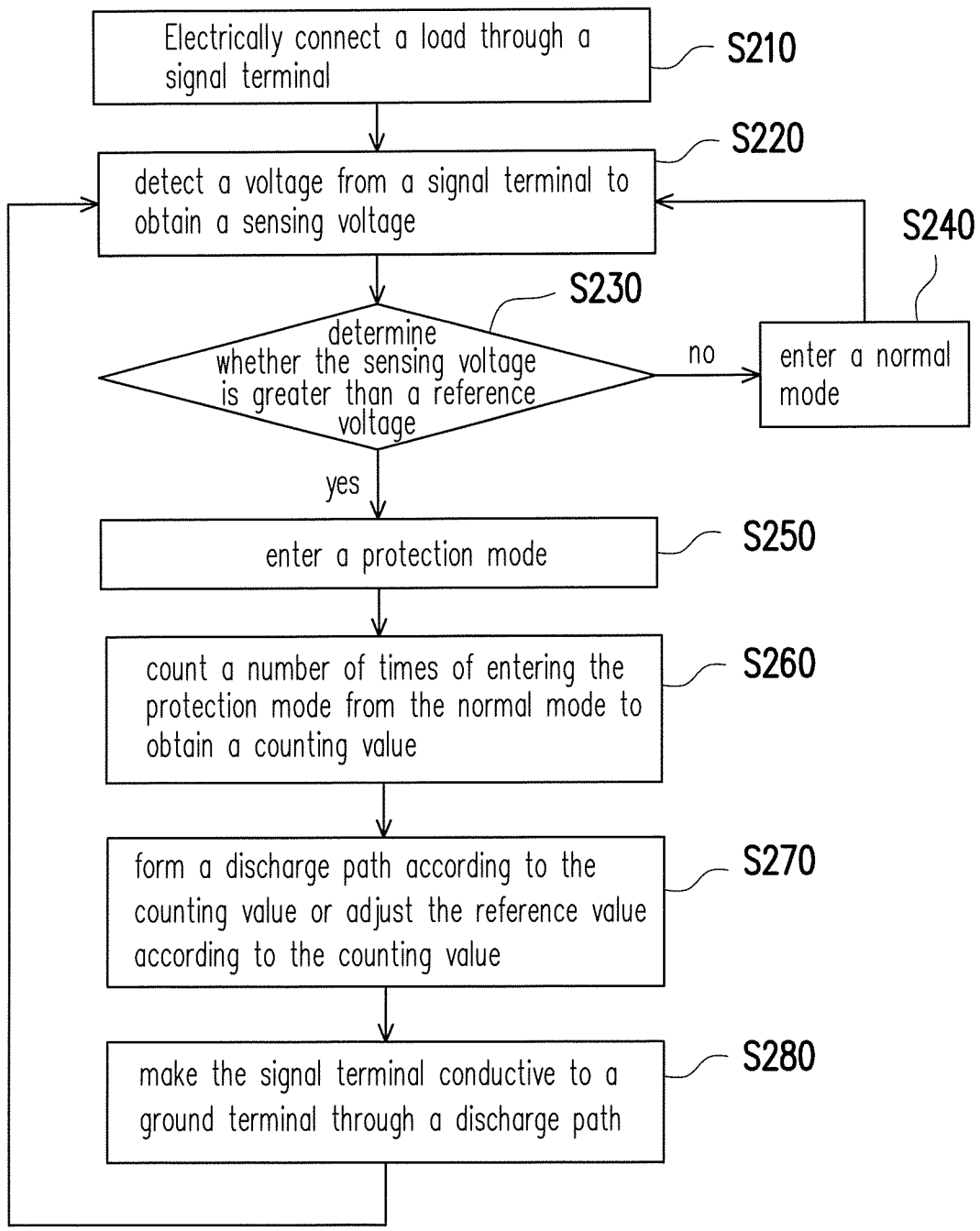
FIG. 2 is a flowchart illustrating an operation method of a battery protection device according to an embodiment of the invention.

FIG. 2 is a flowchart illustrating an operation method of a battery protection device according to an embodiment of the invention. In the following, the over-current protection provided by the battery protection device 100 is described in detail with reference to FIGS. 1 and 2. As shown in Step S210, the battery protection device 100 may be electrically connected to the load 12 supplied with power by the battery set 11 through the signal terminal 105. In addition, as shown in Step S220, the control circuit 120 may detect a voltage from the signal terminal 105 to obtain the sensing voltage. The sensing voltage is a voltage related to the discharge current of the battery set 11. Moreover, as shown in Step S230, the control circuit 120 may compare the sensing voltage with a reference voltage to determine whether the battery protection device 100 detects an over-current.

For example, when the discharge current of the battery set 11 is excessive, a voltage that drops on a conductive resistor of the charge protection switch 13 and the discharge protection switch 14 increases correspondingly, thereby correspondingly increasing the sensing voltage at the signal terminal 105. Therefore, when the sensing voltage is not greater than the reference voltage, the detection unit 121 may determine that the discharge current does not exceed a preset maximum discharge current. At this time, as shown in Step S240, the control circuit 120 makes the battery protection device 100 enter a normal mode.

Alternatively, when the sensing voltage is greater than the reference voltage, as shown in Step S250, the control circuit 120 makes the battery protection device 100 enter a protection mode. In the protection mode, the battery protection device 100 turns off the discharge protection switch 14 to activate the over-current protection. Moreover, as shown in Step S260, the control circuit 120 counts a number of times that the battery protection device 100 switches from the normal mode to the protection mode, so as to obtain a counting value. In other words, the control circuit 120 uses the counting value to record the number of times that the battery protection device 100 switches from the normal mode to the protection mode.

For example, before entering the protection mode, the battery protection device 100 may be in the protection mode or the normal mode. Therefore, the battery protection device 100 may enter the protection mode by switching from the normal mode to the protection mode, or entering the protection mode again. In addition, when the battery protection device 100 switches from the normal mode to the protection mode, the control circuit 120 adds the counting value by 1. In addition, during initialization of a system, the battery protection device 100 may reset the counting value as 0 according to a power on reset (POR) signal. Besides, the battery protection device 100 may also reset the counting value as 0 according to replacement of the battery set 11. Also, the battery protection device 100 may set a counting threshold value internally, and reset the counting value as 0 when the counting value accumulates and reaches the counting threshold value.

It should also be noted that when the load 12 is abnormal, the battery protection device 100 may alternately switch between the normal mode and the protection mode, so that the counting value gradually increases. In other words, the control circuit 120 may determine whether the load 12 is abnormal according to the counting value. Besides, in the protection mode, as shown in Step S270, the battery protection device 100 may adjust the reference voltage according to the counting value or form a discharge path in the discharge circuit according to the counting value. Moreover, as shown in Step S280, the signal terminal 105 of the battery protection device 100 is conductive to the ground GND through the discharge path. In this way, when the load 12 is abnormal, the battery protection device 100 may adapt Step S270 to lower the reference voltage or increase an equivalent resistor of the discharge path to make it more difficult for the charge protection device 100 to deactivate the over-current protection, so as to prevent the battery protection device 100 from turning on the over-current protection repetitively due to the abnormality of the load 12.

Figure 3:
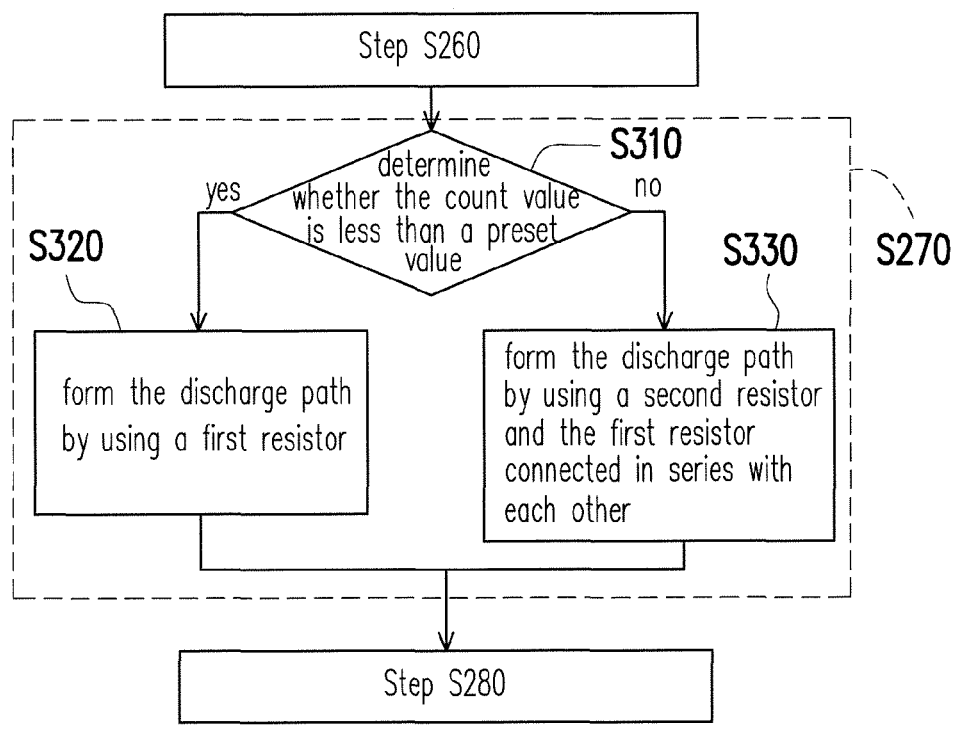
FIG. 3 is a flowchart illustrating Step S270 according to an embodiment of the invention.

The embodiment shown in FIG. 1 further provides an example showing a configuration that the battery protection device 100 forms the discharge path according to the counting value in the protection mode, and FIG. 3 is a flowchart illustrating Step S270 according to an embodiment of the invention. In the following, details regarding operations of the discharge circuit 110 and the control circuit 120 are described with reference to FIGS. 1 and 3.

In an operation, the detection unit 121 compares a reference voltage VR1 with the sensing voltage from the signal terminal 105. When the sensing voltage is greater than the reference voltage VR1, the detection unit 121 generates a first triggering signal. Alternatively, when the sensing voltage is not greater than the reference voltage VR1, the detection unit 121 generates a second triggering signal. Besides, the oscillator 124 provides an oscillating signal, and the counter 122 uses the oscillating signal to count the first triggering signal or the second triggering signal, so as to generate an enable pulse or a disable pulse accordingly.

For example, when the sensing voltage is not greater than the reference voltage VR1, the counter 122 may count the second triggering signal by using the oscillating signal, so as to output the disable pulse after the second triggering signal remains for a second preset time. Thus, the controller 123 may switch the battery protection device 100 into the normal mode according to the disable pulse. Moreover, in the normal mode, the controller 123 may control the discharge circuit 110 according to the disable pulse, such that the discharge circuit 110 does not provide the discharge path. For example, in the normal mode, the discharge circuit 110 may turn off the first switch T11 and turn on the second switch T12.

Alternatively, when the sensing voltage is greater than the reference voltage VR1, the counter 122 may count the first triggering signal by using the oscillating signal, so as to output the enable pulse after the first triggering signal remains for a first preset time. Thus, the controller 123 may switch the battery protection device 100 to the protection mode according to the enable pulse. In addition, in the protection mode, the controller 123 may accumulate the counting value according to the enable pulse. For example, each time the battery protection device 100 switches from the normal mode to the protection mode, the counter 122 generates the enable pulse. Thus, the controller 123 may use the enable pulse to accumulate the counting value, so as to obtain the number of times that the battery protection device 100 switches from the normal mode to the protection mode.

Also, in the protection mode, the controller 123 controls the discharge circuit 110 according to the counting value. For example, as shown in Step S310 in FIG. 3, the controller 123 determines whether the counting value is less than a preset value. The preset value may be less than or equal to the counting threshold value. Moreover, when the counting value is less than the preset value, the controller 123 may control the discharge circuit 110 to make the discharge circuit 110 turn on the first switch T11 and the second switch T12. Thus, as shown in Step S320, the battery protection device 100 may use the first resistor R11 to form the discharge path for conducting the signal terminal 105 to the ground GND.

Alternatively, when the counting value is not less than the preset value, the controller 123 determines that the load 12 is abnormal. At this time, under the control of the controller 123, the discharge circuit 110 turns on the first switch T11 and turns off the second switch T12. Accordingly, as shown in Step S330, the battery protection device 100 may use the second resistor R12 and the first resistor R11, that are connected in series with each other, to form the discharge path that makes the signal terminal 105 conductive to the ground GND. Since the discharge paths formed by using the second resistor R12 and the first resistor R11 have a greater equivalent resistor, it is more difficult for the battery protection device 100 to deactivate the over-current protection under such circumstance. Thus, the battery protection device 100 may be prevented from repetitively activating the over-current protection due to the abnormality of the load 12.

Figure 4:
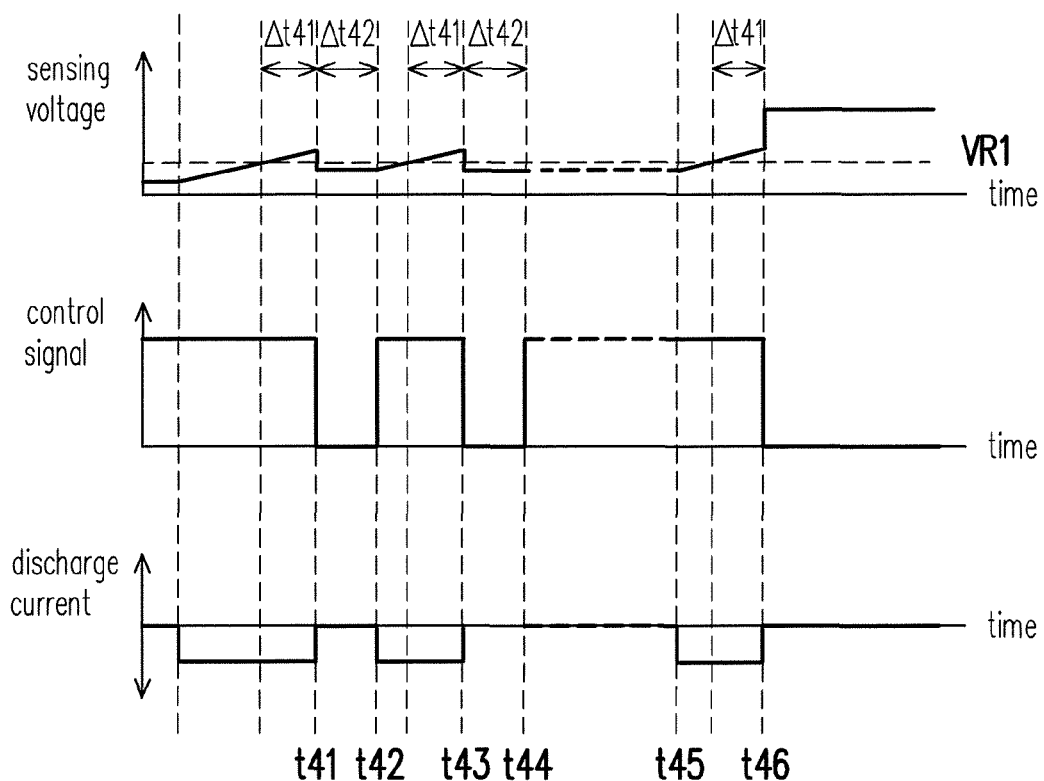
FIG. 4 is a diagram illustrating a time sequence of a battery protection device according to an embodiment of the invention.

For example, FIG. 4 is a diagram illustrating a time sequence of the battery protection device according to an embodiment of the invention. Here, it is assumed that an initial state of the battery protection device 100 is in the normal mode, and an initial value of the counting value is 0. As shown in FIG. 4, at a time point t41, the sensing voltage is greater than the reference voltage VR1 for a first preset time Δt41. Therefore, the battery protection 100 may switch to the protection mode at the time point t41, and add the counting value to 1. At this time, since the counting value is less than the preset value (e.g. 10), so the battery protection device 100 may use the first resistor R11 to form the discharge path for conducting the signal terminal 105 to the ground GND.

Besides, since the load 12 is abnormal (e.g. the load 12 is excessive in the protection mode), the sensing voltage soon drops to a level lower than the reference voltage VR1 after the battery protection device 100 switches to the protection mode. Moreover, when the sensing voltage is less than the reference voltage VR1 for a second preset time Δt42, the battery protection device 100 may switch to the normal mode at a time point t42. When it is switched back to the normal mode, the sensing voltage continuously increases again. Therefore, the battery protection device 100 switches to the protection mode at a time point t43 and adds the counting value to 2. Then, because the load 12 is abnormal, the battery protection device 100 then switches to the normal mode at a time point t44.

Accordingly, between the time point t44 and a time point t45, the battery protection device 100 may switch back and forth between the protection mode and the normal mode to add the counting value to the preset value (e.g. 10) due to the abnormality of the load 12. Thus, when the battery protection device 100 again switches to the protection mode at a time point t46, the battery protection device 100 may use the first resistor R11 and the second resistor R12 to form the discharge path, so as to increase the sensing voltage at the signal terminal 105. Thus, the battery protection device 100 may be kept in the protection mode, so as to prevent the battery protection device 100 from repetitively activating the over-current protection due to the abnormality of the load 12. Besides, as shown in FIG. 4, during the protection mode, such as a time period between the time points t41 and t42, the battery protection device 100 switches a control signal, which is used to control the discharge protection switch 14, to a low level. Thus, in the protection mode, the battery protection device 100 may turn off the discharge protection switch 14 to stop the battery set 11 from generating the discharge current.

Figure 5:
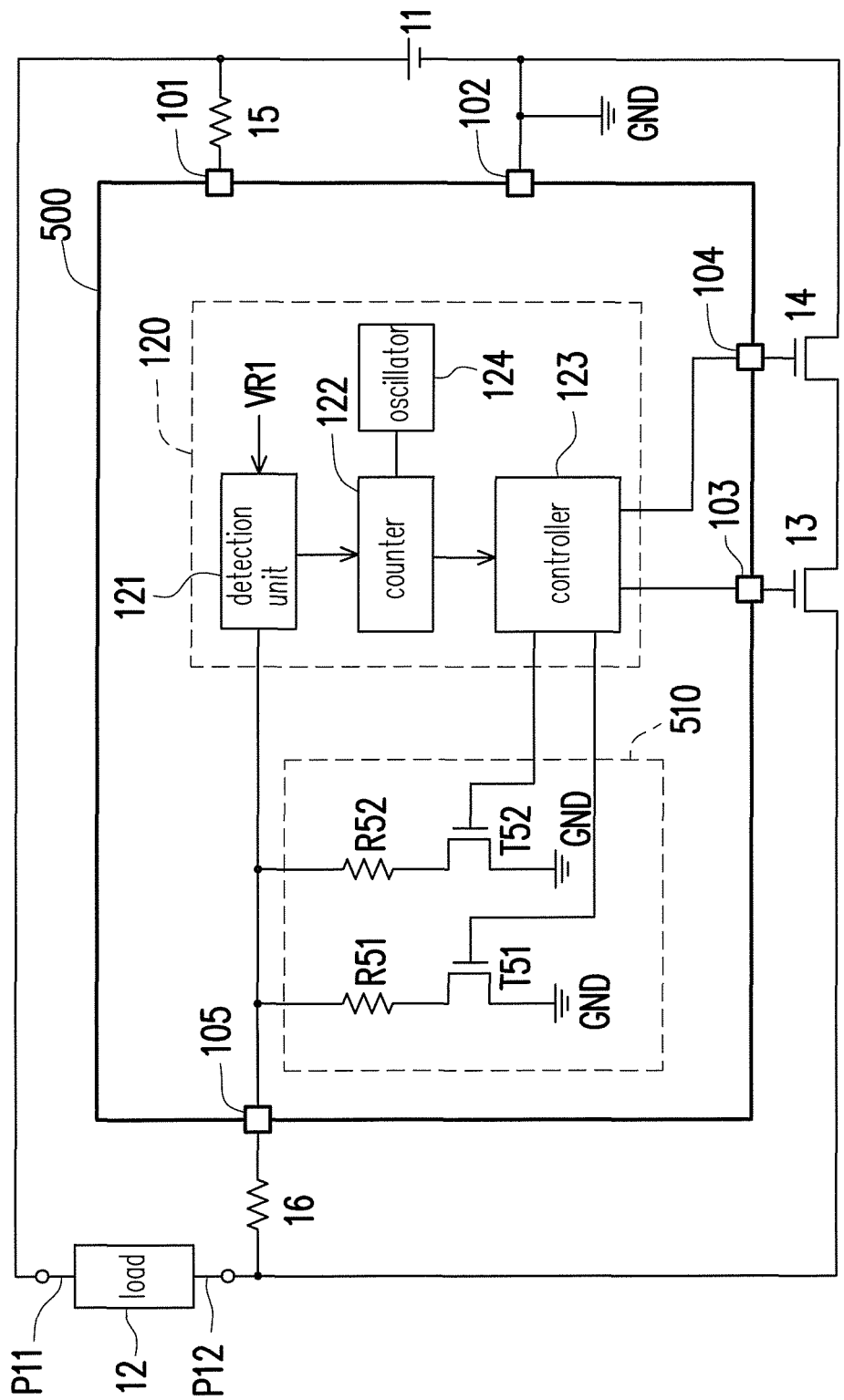
FIG. 5 is a schematic view illustrating a battery protection device according to another embodiment of the invention.
Figure 6:
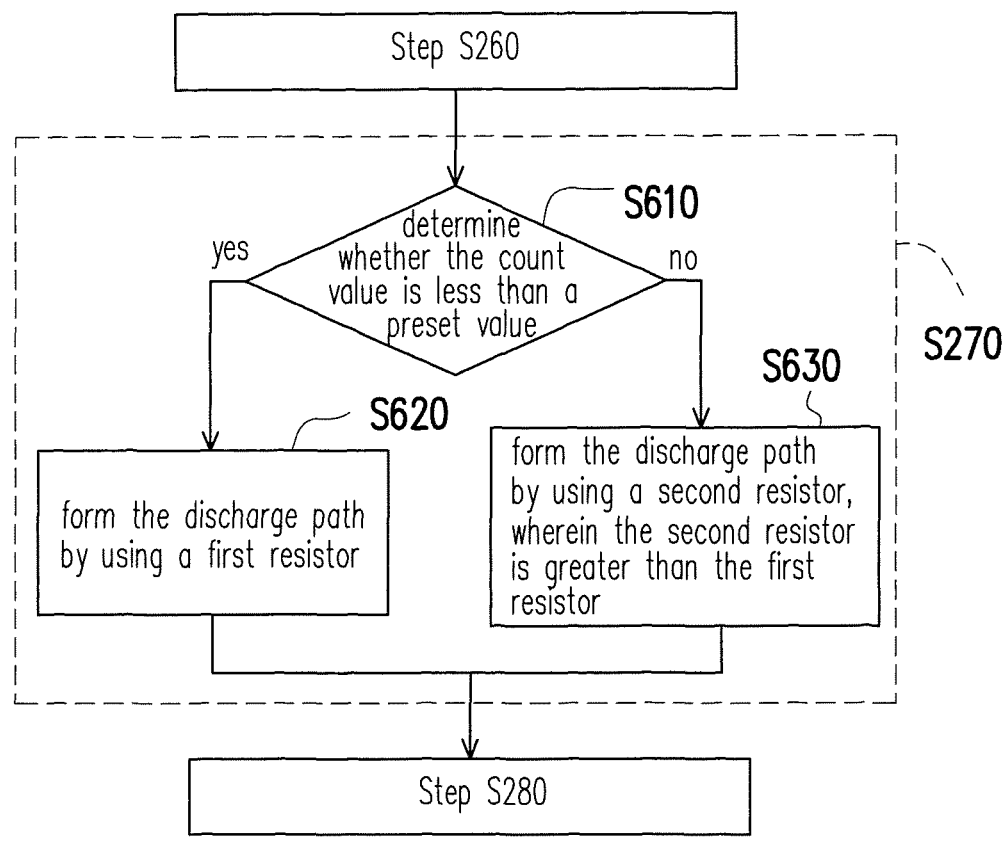
FIG. 6 is a flowchart illustrating Step S270 according to another embodiment of the invention.

FIG. 5 is a schematic view illustrating a battery protection device according to another embodiment of the invention. The embodiment shown in FIG. 5 describes another configuration that a battery protection device 500 forms a discharge path according to the counting value in the protection mode, and FIG. 6 is a flowchart illustrating Step S270 according to another embodiment of the invention.

Specifically, compared with the embodiment shown in FIG. 1, a discharge circuit 510 shown in FIG. 5 includes a first resistor R51, and second resistor R52, a first switch T51, and a second switch T52. In addition, the first resistor R51 and the first switch T51 are connected in series between the signal terminal 105 and the ground GND. The second resistor R52 and the second switch T52 are connected in series between the signal terminal 105 and the ground GND. Also, the second resistor R52 is greater than the first resistor R51.

In an operation, when the battery protection device 500 enters the normal mode, the discharge circuit 510 turns off the first switch T51 and the second switch T52 under the control of the controller 123. Besides, when the battery protection 500 enters the protection mode, as shown at Step S610, the controller 123 determines whether the counting value is less than the preset value. Moreover, when the counting value is less than the preset value, the controller 123 may control the discharge circuit 510 to make the discharge circuit 510 turn on the first switch T51 and turn off the second switch T52. Thus, as shown in Step S620, the battery protection device 500 may use the first resistor R51 to form the discharge path for conducting the signal terminal 105 to the ground GND.

Alternatively, when the counting value is not less than the preset value, the controller 123 determines that the load 12 is abnormal. At this time, under the control of the controller 123, the discharge circuit 510 turns off the first switch T51 and turns on the second switch T52. Thus, as shown in Step S630, the battery protection device 500 may use the second resistor R52 to form the discharge path for conducting the signal terminal 105 to the ground GND. In this way, when the load 12 is abnormal in the protection mode (e.g. the load 12 is excessive in the protection mode), the battery protection device 500 may use the second resistor R52 to form the discharge path, so as to increase the sensing voltage at the signal terminal 105, thereby preventing the battery protection device 500 from repetitively activating the over-current protection due to the abnormality of the load 12. Other details of the battery protection device 500 shown in FIG. 5 are already included in the embodiments described above. Thus, such details will not be reiterated below.

Figure 7:
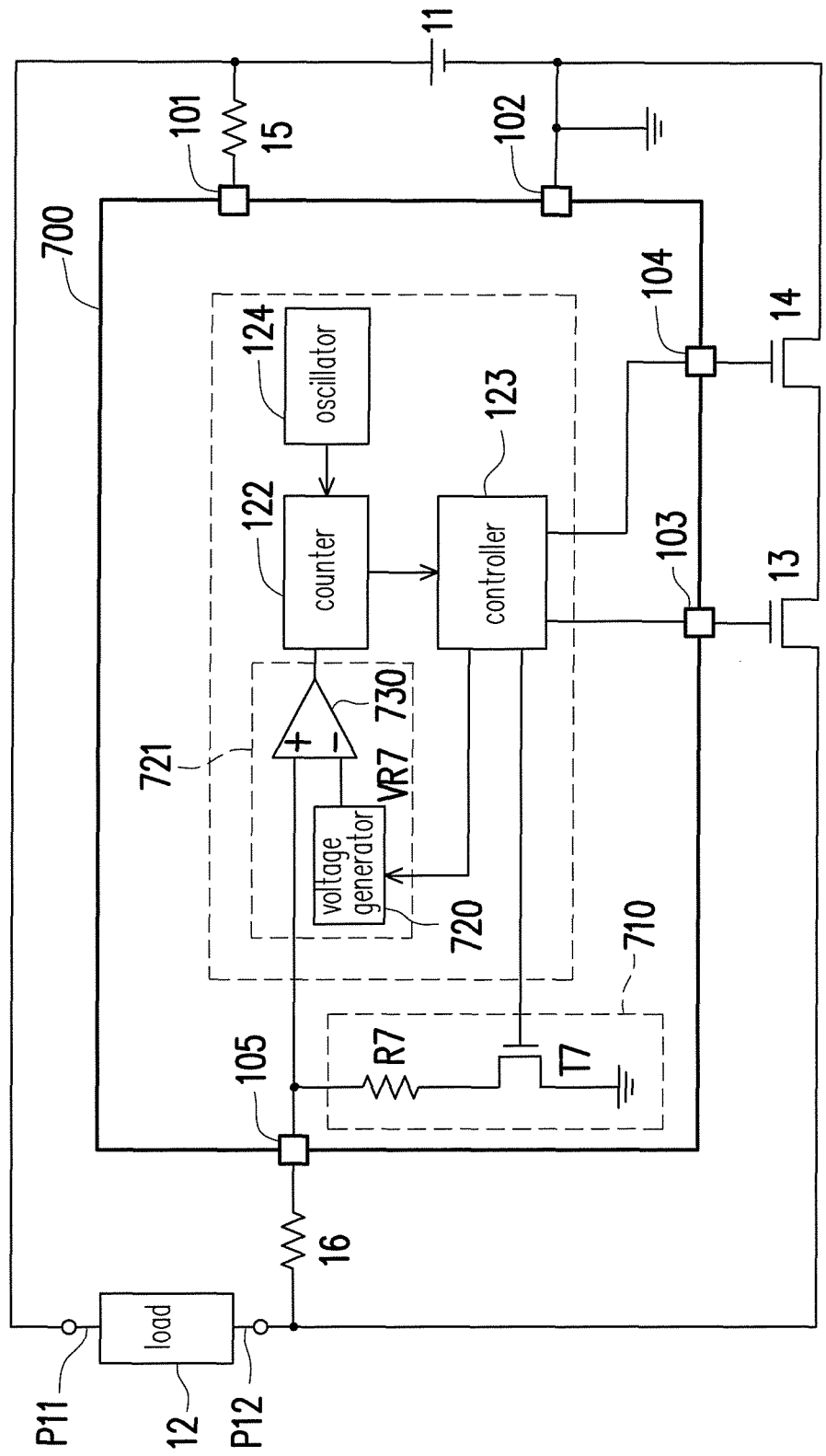
FIG. 7 is a schematic view illustrating a battery protection device according to yet another embodiment of the invention.
Figure 8:
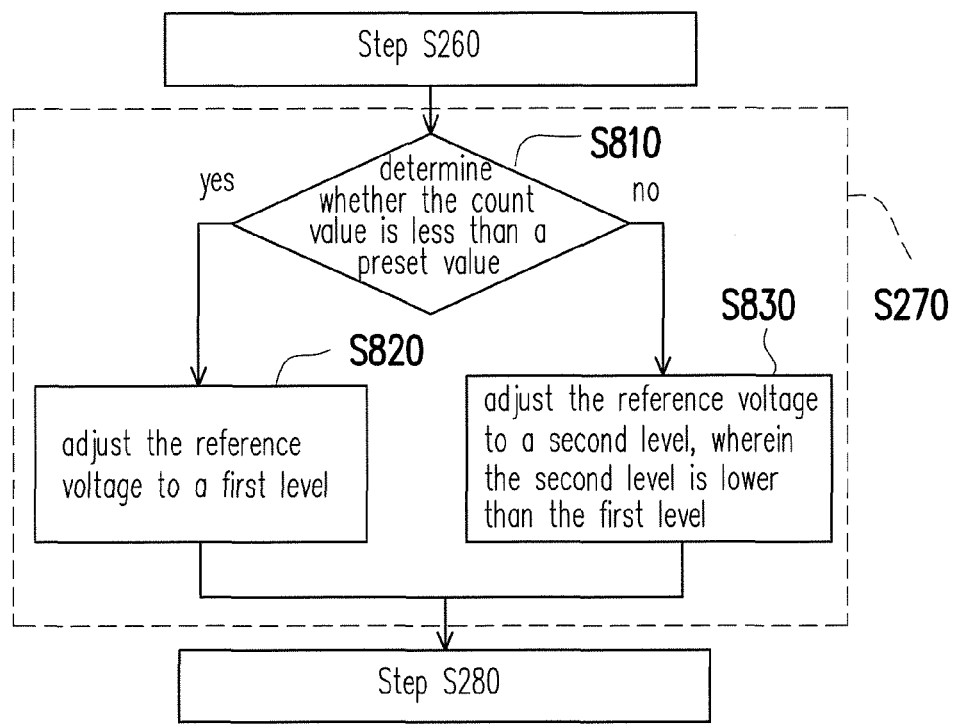
FIG. 8 is a flowchart illustrating Step S270 according to yet another embodiment of the invention.

FIG. 7 is a schematic view illustrating a battery protection device according to yet another embodiment of the invention. In addition, the embodiment shown in FIG. 7 describes a configuration that a battery protection device 700 adjusts the reference voltage according to the counting value in the protection mode, and FIG. 8 is a flowchart illustrating Step S270 according to yet another embodiment of the invention.

Specifically, compared to the embodiment shown in FIG. 1, a discharge circuit 710 shown in FIG. 7 includes a resistor R7 and a switch T7, and a detection unit 721 shown in FIG. 7 includes a voltage generator 720 and a comparator 730. In addition, the resistor R7 and the switch T7 are connected in series between the signal terminal 105 and the ground GND. The voltage generator 720 is adapted to generate a reference voltage VR7. A positive input terminal of the comparator 730 is electrically connected to the signal terminal 105 to receive the sensing voltage. A negative input terminal of the comparator 730 is electrically connected to the voltage generator 720 to receive the reference voltage VR7.

In an operation, the comparator 730 compares the sensing voltage and the reference voltage VR7. In addition, when the sensing voltage is greater than the reference voltage VR7, the comparator 730 may output the first triggering signal through an output end of the comparator 730, to make the battery protection device 700 enter the protection mode. Alternatively, when the sensing voltage is not greater than the reference voltage VR7, the comparator 730 may output the second triggering signal through the output end of the comparator to make the battery protection device 700 enter the normal mode. Also, when the battery protection device 700 enters the normal mode, the discharge circuit 710 may turn off the switch T7 under the control of the controller 123. Alternatively, when the battery protection device 700 enters the protection mode, the discharge circuit 710 turns on the switch T7 under the control of the controller 123. Thus, the battery protection device 700 may use the resistor R7 to form the discharge path that makes the signal terminal 105 conductive to the ground GND.

Besides, in the protection mode, as shown in Step S810, the controller 123 may determine whether the counting value is less than the preset value. When the counting value is less than the preset value, as shown in Step S820, the controller 123 may control the voltage generator 720, such that the voltage generator 720 adjusts the reference voltage VR7 to a first level. Alternatively, when the counting value is not less than the preset value, the controller 123 determines that the load 12 is abnormal. At this time, as shown in Step S830, the voltage generator 720 may adjust the reference voltage VR7 to a second level under the control of the controller 123. In addition, the second level is lower than the first level. Thus, when the load 12 is abnormal in the protection mode (e.g. the load 12 is excessive in the protection mode), the battery protection device 700 may lower the reference voltage VR7, so as to prevent the battery protection device 700 from repetitively activating the over-current protection due to the abnormality of the load 12.

Figure 9:
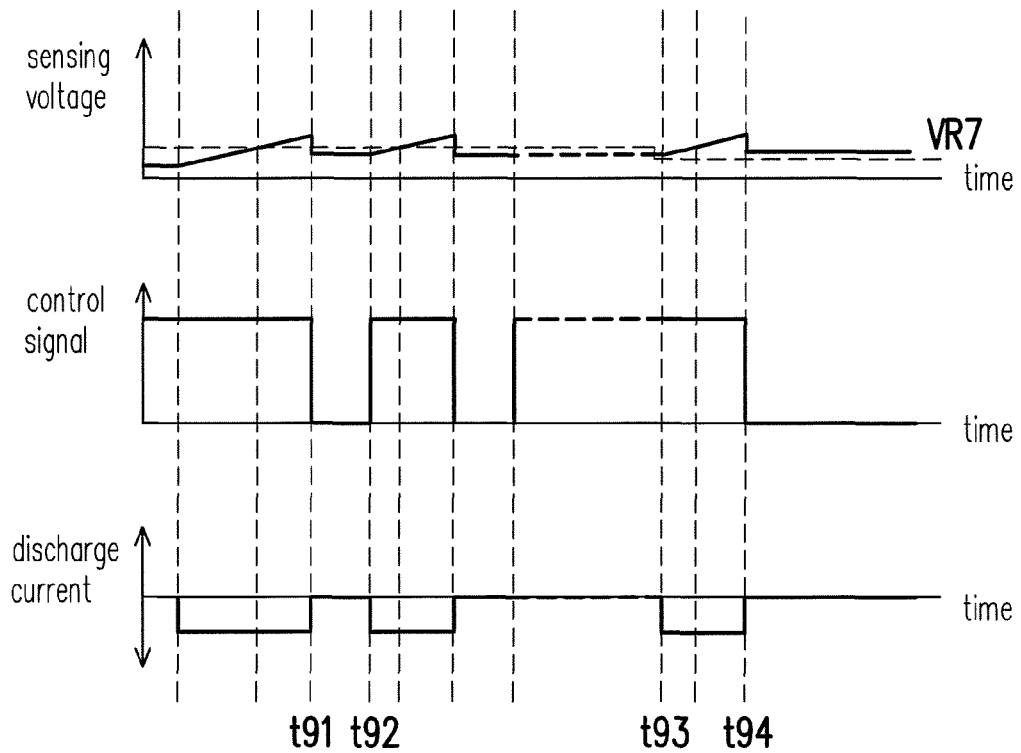
FIG. 9 is a diagram illustrating a time sequence of a battery protection device according to another embodiment of the invention.

For example, FIG. 9 is a diagram illustrating a time sequence of a battery protection device according to another embodiment of the invention. Similar to the embodiment shown in FIG. 4, the battery protection device 700 may switch to the protection mode at a time point t91, and adds the counting value to 1. At this time, since the counting value is less than the preset value (e.g. 10), so the battery protection device 700 may adjust the reference voltage VR7 to the first level. Also, due to the abnormality of the load 12, the battery protection device 700 may switch to the normal mode at a time point t92.

Accordingly, between the time point t92 and a time point t93, the battery protection device 700 may switch back and forth between the protection mode and the normal mode due to the abnormality of the load 12, making the counting value greater than the preset value (e.g. 10). Thus, at the time point t93, the battery protection device 700 already lowers the reference voltage VR7 from the first level to the second level. In this way, when the battery protection device 700 again switches to the protection mode at a time point t94, the sensing voltage is greater than the reference voltage VR7. Thus, the battery protection device 700 may be kept in the protection mode, so as to prevent the battery protection device 700 from repetitively activating the over-current protection due to the abnormality of the load 12. Other details of the battery protection device 700 shown in FIG. 7 are already included in the embodiments described above. Thus, such details will not be reiterated below.

In view of the foregoing, the counting value is used in the invention to record the number of times that the battery protection device switches from the normal mode to the protection mode. Moreover, in the protection mode, the reference voltage is adjusted or the discharge path is formed according to the counting value. Thus, the battery protection device is able to determine the abnormality of the load, so as to prevent the battery protection device from repetitively activating the over-current protection due to the abnormality of the load.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A battery protection device, adapted to be electrically connected to a battery set and a load, the battery protection device comprising:
    a signal terminal, configured to be electrically connected to the load;
    a discharge circuit, electrically connected to the signal terminal; and
    a control circuit, electrically connected to the signal terminal and the discharge circuit to detect a sensing voltage from the signal terminal and count a number of times that the battery protection device switches from a normal mode to a protection mode, so as to obtain a counting value, wherein the control circuit determines whether to enter the normal mode or the protection mode according to a reference voltage, and in the protection mode, the control circuit adjusts the reference voltage according to the counting value or controls the discharge circuit according to the counting value to form a discharge path passing through the signal terminal, the discharge path, and a ground.

2. The battery protection device as claimed in claim 1, wherein when the sensing voltage is not greater than the reference voltage, the battery protection device enters the normal mode, and when the sensing voltage is greater than the reference voltage, the battery protection device enters the protection mode.

3. The battery protection device as claimed in claim 1, wherein the discharge circuit comprises a first resistor and a second resistor, when the counting value is less than a preset value, the battery protection device forms the discharge path through the first resistor, and when the counting value is not less than the preset value, the battery protection device forms the discharge path through the second resistor and the first resistor that are connected in series with each other.

4. The battery protection device as claimed in claim 3, wherein the discharge path further comprises:
    a first switch, wherein the first switch, the first resistor and the second resistor are connected in series between the signal terminal and the ground; and
    a second switch, connected in parallel with the second resistor,
    wherein when the counting value is less than the preset value in the protection mode, the discharge circuit turns on the first switch and the second switch, when the counting value is not less than the preset value in the protection mode, the discharge circuit turns on the first switch and turns off the second switch, and in the normal mode, the discharge circuit turns off the first switch and turns on the second switch.

5. The battery protection device as claimed in claim 1, wherein the discharge circuit comprises a first resistor and the second resistor, when the counting value is less than a preset value, the battery protection device uses the first resistor to form the discharge path, when the counting value is not less than the preset value, the battery protection device uses the second resistor to form the discharge path, and the second resistor is greater than the first resistor.

6. The battery protection device as claimed in claim 5, wherein the discharge path further comprises:
    a first switch, connected in series with the first resistor between the signal terminal and the ground; and
    a second switch, connected in series with the second resistor between the signal terminal and the ground,
    wherein when the counting value is less than the preset value in the protection mode, the discharge circuit turns on the first switch and turns off the second switch, when the counting value is not less than the preset value in the protection mode, the discharge circuit turns off the first switch and turns on the second switch, and in the normal mode, the discharge circuit turns off the first switch and the second switch.

7. The battery protection device as claimed in claim 1, wherein when the counting value is less than a preset value, the control circuit adjusts the reference voltage to a first level, and when the counting value is not less than the preset value, the control circuit adjusts the reference voltage to a second level, wherein the second level is lower than the first level.

8. The battery protection device as claimed in claim 1, wherein the control circuit comprises:
    a detection unit, comparing the sensing voltage with the reference voltage and generating a first triggering signal or a second triggering signal according to a comparison result;
    an oscillator, providing an oscillating signal;
    a counter, counting the first triggering signal or the second triggering signal according to the oscillating signal, and generating an enable pulse or a disable pulse accordingly; and
    a controller, switching the battery protection device to the protection mode according to the enable pulse, and switching the batter protection device to the normal mode according to the disable pulse, wherein in the protection mode, the controller accumulates the counting value according to the enable pulse and the controller controls the discharge circuit or adjusts the reference voltage according to the counting value.

9. The battery protection device as claimed in claim 8, wherein the detection unit comprises:
    a voltage generator, generating the reference voltage, wherein the voltage generator is controlled by the controller to adjust the reference voltage; and
    a comparator, wherein a positive input terminal of the comparator is electrically connected to the signal terminal, a negative input terminal of the comparator receives the reference voltage, and an output end of the comparator outputs the first triggering signal or the second triggering signal.

10. The battery protection device as claimed in claim 9, wherein the discharge circuit comprises a resistor and a switch, the resistor and the switch are connected in series between the signal terminal and the ground, the resistor is electrically connected to the positive input terminal of the comparator, the discharge circuit turns on the switch in the protection mode, and the discharge circuit turns off the switch in the normal mode.

11. The battery protection device as claimed in claim 1, wherein a first end of the load is electrically connected to a first end of the battery set, a second end of the load is electrically connected to a second end of the battery set through at least one protection switch, and the signal terminal of the battery protection device is adapted to be electrically connected to the second end of the load.

12. An operation method of a battery protection device, wherein the battery protection device is adapted to be electrically connected to a battery set and a load, the operation method of the battery protection device comprising:

electrically connecting to the load through a signal terminal of the battery protection device;
   detecting a voltage from the signal terminal to obtain a sensing voltage;
   determining whether to enter a normal mode or a protection mode according to a reference voltage;
   counting a number of times of switching from the normal mode to the protection mode to obtain a counting value; and
   in the protection mode, adjusting the reference voltage according to the counting value or forming a discharge path according to the counting value, and making the signal terminal of the battery protection device conductive to a ground through the discharge path.

13. The operation method of the battery protection device as claimed in claim 12, wherein the step of forming the discharge path according to the counting value comprises:

determining whether the counting value is less than a preset value;
   when the counting value is less than the preset value, forming the discharge path by using a first resistor; and
   when the counting value is not less than the preset value, forming the discharge path by using a second resistor and the first resistor that are connected in series with each other.

14. The operation method of the battery protection device as claimed in claim 12, wherein the step of forming the discharge path according to the counting value comprises:

determining whether the counting value is less than a preset value;
   when the counting value is less than the preset value, forming the discharge path by using a first resistor; and
   when the counting value is not less than the preset value, forming the discharge path by using a second resistor, wherein the second resistor is greater than the first resistor.

15. The operation method of the battery protection device as claimed in claim 12, wherein the step of adjusting the reference voltage according to the counting value comprises:

determining whether the counting value is less than a preset value;
   when the counting value is less than the preset value, adjusting the reference voltage to a first level; and
   when the counting value is not less than the preset value, adjusting the reference voltage to a second level, wherein the second level is lower than the first level.

16. The operation method of the battery protection device as claimed in claim 12, further comprising:

when the sensing voltage is not greater than the reference voltage, entering the normal mode; and
   when the sensing voltage is greater than the reference voltage, entering the protection mode.

17. The operation method of the battery protection device as claimed in claim 12, wherein a first end of the load is electrically connected to a first end of the battery set, a second end of the load is electrically connected to a second end of the battery set through at least one protection switch, and the signal terminal is electrically connected to the second end of the load.

* * * * *